United States Patent [19]
Gahang et al.

[11] Patent Number: 5,548,634
[45] Date of Patent: Aug. 20, 1996

[54] ALPHANUMERIC REGISTRATION METHOD AND DEVICE OF A SYSTEM WITH ALPHANUMERIC ENTRY KEYS

[75] Inventors: Gu-Su Gahang, Kyungki-do; Bong-Seog Song, Seoul; Hyun-Jun Lee, Kyungki-do; Ju-Yeong Ahn, Seoul, all of Rep. of Korea

[73] Assignee: SamSung Electronics Co., Ltd., Kyungki-do, Rep. of Korea

[21] Appl. No.: 267,746

[22] Filed: Jul. 5, 1994

[30] Foreign Application Priority Data

Nov. 27, 1993 [KR] Rep. of Korea ............... 1993-25495

[51] Int. Cl.$^6$ ............................................. H04M 11/00
[52] U.S. Cl. ........................... 379/97; 379/355; 379/356
[58] Field of Search .................................. 379/355, 356, 379/216, 201, 96, 88, 104, 99, 97

[56] References Cited

U.S. PATENT DOCUMENTS

| | | |
|---|---|---|
| 3,870,821 | 3/1975 | Steury . |
| 3,976,840 | 8/1976 | Cleveland et al. ............... 379/99 |
| 4,007,443 | 2/1977 | Bromberg et al. ............... 379/99 |
| 4,012,599 | 3/1977 | Meyer . |
| 4,291,198 | 9/1981 | Anderson et al. ............... 379/96 |
| 4,307,266 | 12/1981 | Messina . |
| 4,427,848 | 1/1984 | Tsakanikas ...................... 379/88 |
| 4,475,013 | 10/1984 | Lee et al. . |
| 4,503,288 | 3/1985 | Kessler ............................ 379/104 |
| 4,585,908 | 4/1986 | Smith . |
| 4,674,112 | 6/1987 | Kondraske et al. . |
| 4,677,659 | 6/1987 | Dargan . |
| 4,814,972 | 3/1989 | Winter et al. ................... 379/96 |
| 4,817,129 | 3/1989 | Riskin ............................. 379/97 |
| 4,918,721 | 4/1990 | Hashimoto ...................... 379/97 |
| 4,969,136 | 11/1990 | Chamberlin et al. ............ 379/96 |
| 4,975,896 | 12/1990 | D'Agosto, III et al. ......... 379/96 |
| 5,054,058 | 10/1991 | Kakizawa ........................ 379/216 |
| 5,086,456 | 2/1992 | Shizawa et al. ................. 379/216 |
| 5,105,375 | 4/1992 | Lapeyre . |
| 5,109,352 | 4/1992 | O'Dell . |
| 5,184,315 | 2/1993 | Lapeyre . |
| 5,245,653 | 9/1993 | Izumi .............................. 379/216 |
| 5,249,220 | 9/1993 | Moskowitz et al. ............. 379/96 |
| 5,272,748 | 12/1993 | Davis ............................... 379/216 |
| 5,274,693 | 12/1993 | Waldman ......................... 379/216 |
| 5,335,276 | 8/1994 | Thompson et al. .............. 379/201 |
| 5,392,338 | 2/1995 | Danish et al. ................... 379/97 |
| 5,394,462 | 2/1995 | Maemura ......................... 379/216 |

OTHER PUBLICATIONS

Charles Schwab "Schwab Telebroker Service" Brochure, Cover, Back, pp. 1, 2 & 7–14, Oct. 1993.

Broomfield et al., "Making A Data Terminal Out Of The Touch–Tone Telephone", Electronics, Jul. 1980.

Mehl, "The 76E Subset Used As A Data Terminal", Teleteknik 1979, No. 1, pp. 34–36.

Primary Examiner—Krista M. Zele
Assistant Examiner—Scott Wolinsky
Attorney, Agent, or Firm—Robert E. Bushnell, Esq.

[57] ABSTRACT

An alphanumeric registration method and device using a push button telephone with alphanumeric entry keys is disclosed. Alphanumeric characters are classified into group information and party information representative of ten arabic numerals, alphabetic capital letters, and alphabetic small letters. When two successive key strokes corresponding to the group and party information are made, an alphanumeric registration subroutine is executed, thereby storing a single alphanumeric character corresponding to the selected group and party in a predetermined register. Accordingly, a user can easily register information such as a telephone number and/or an identification code by utilizing the alphanumeric entry keys. The present invention is widely applicable to many types of products having alphanumeric entry keys, including, but not limited to facsimile machines, high performance telephones, voice mailing systems (VMS) and audio response systems (ARS).

22 Claims, 4 Drawing Sheets

FIG. 4A

| Addr | Val |
|---|---|
| 1000 | 1 |
| 1001 | 2 |
| 1002 | 3 |
| 1003 | 4 |
| 1004 | 5 |
| 1005 | 6 |
| 1006 | 7 |
| 1007 | ? |
| 1008 | X |
| 1009 | X |
| 1010 | G |
| | G |
| | S |
| | ? |
| | ... |
| 1019 | X |
| 1020 | 5 |
| | 9 |
| | 4 |
| | 2 |
| | 5 |
| | 8 |
| 1029 | ? |
| 1030 | k |
| | a |
| | n |
| | g |
| | 3 |
| | 0 |
| 1039 | ? |

- 1000–1006: 42
- 1008–1009: DON'T CARE, 40
- 1010–1019: 44 DON'T CARE
- 1020–1029: 48
- 1030–1039: 50
- 46

FIG. 4B

| Addr | Val |
|---|---|
| 2000 | 9 |
| 2001 | 8 |
| 2002 | 7 |
| 2003 | 6 |
| 2004 | 5 |
| 2005 | 4 |
| 2006 | ? |
| 2007 | X |
| 2008 | X |
| 2009 | X |
| 2010 | G |
| 2011 | O |
| 2012 | O |
| 2013 | D |
| 2014 | ? |
| | ... |
| 2019 | X |
| 2020 | |
| ... | |
| 2029 | |

- 2000–2005: 62
- 2007–2009: DON'T CARE
- 2010–2013: 64
- DON'T CARE
- 60

ALPHANUMERIC REGISTRATION METHOD AND DEVICE OF A SYSTEM WITH ALPHANUMERIC ENTRY KEYS

CROSS REFERENCE TO RELATED APPLICATIONS

This application makes reference to, incorporates herein and claims all benefits accruing from our application earlier filed in the Korean Industrial Property Office on Nov. 27, 1993 of our application entitled *ALPHANUMERIC REGISTRATION METHOD AND DEVICE OF A SYSTEM WITH ALPHANUMERIC ENTRY KEYS*, which application was duly assigned Ser. No. 25495/1993.

BACKGROUND OF THE INVENTION

The present invention relates to a method and device for entering alphanumeric characters using a push button telephone, and more particularly, to a method and device for effectively registering alphanumeric information into a system capable of entering alphanumeric characters.

Many conventional information searching systems that provide voice information to system users provide no means for entering alphanumeric characters into the system through the telephone. These conventional systems often facilitate entry of information by utilizing menu-driven algorithms in which a user enters alphanumeric data by stroking a numeric key corresponding to a desired menu function. To overcome the burden and expense of providing such elaborate systems, methods for entering and registering alphanumeric characters by utilizing the buttons of a telephone have been developed. Some of these methods have been applied to various types of electronic products.

"Panasonic" Model KX-F230 facsimile unit is one such product. The unit provides a keypad having alphanumeric entry keys, and additionally enables a user to register a logo, the telephone number of a called party, and the number of pages in a document being transmitted to the called party. The alphanumeric key input method disclosed in this product is slightly modified from a conventional multiple depression method for entering alphanumeric characters in a button-type telephone. The multiple depression method requires a user to press a telephone button either one, two or three times in order to enter a desired alphabetic character. The number of button depressions depends upon the relative position of the desired symbol among the three alphabetic characters corresponding to the particular numeric button.

By way of example, for entry of the capital letter 'A', the numeric button '2' must be pressed once, and for entry of the capital letter 'B', the numeric button '2' must be pressed two times in continuous succession. To enter the capital letter 'C', the numeric button '2' must be pressed three times in continuous succession.

With a currently available device, such as the "Panasonic" Model KX-F230 facsimile unit, in order to enter the capital letter 'A', the numeric button '2' and the '*' button must be pressed in continuous succession. To enter the arabic numeral '2', the numeric button '2' must be pressed seven times in continuous succession, followed by the '*' button being pressed once. The '*' key indicates completion of an entry after a corresponding button has been pressed a desired number of times. Taking numeric button '2' as an example, a symbol to be entered is selected in the order of 'A', 'B', 'C', 'a', 'b', 'c', '2'. Each time numeric button '2' is pressed, the next symbol in the above sequence is activated. In order to enter one of the alphabetic capital letters 'A', 'B', 'C', . . . , numeric button '2' must be pressed from one to three times in continuous succession, to enter one of the alphabetic small letters 'a','b','c', . . . , numeric button '2' must be pressed from four to six times in continuous succession, and to enter the arabic numeral 2, the numeric button '2' must be pressed seven times in continuous succession. We have observed that this method is inconvenient since it requires a multitude of button depressions in order to enter alphanumeric characters.

One attempt to solve this problem is disclosed in U.S. Pat. No. 5,184,315 entitled *Comprehensive Computer Data And Control Entries From Very Few Keys Operable In A Fast Touch Typing Mode* issued to Lapeyre. In this effort, a user can enter commonly used characters, such as vowels A, E, I, O and U with only two key strokes. We note, however, that this reference does not allow the user to register lower case letters. Accordingly, we believe that conventional art, such as Lapeyre '315, has limited application.

An earlier attempt at achieving alphanumeric entry through a minimum number of key depressions is disclosed in U.S. Pat. No. 4,307,266 entitled *Communication Apparatus For The Handicapped* issued to Messina. In this device, a user is able to enter an alphanumeric character by first, depressing a button on which the desired character appears, and then depressing a second button to specify which character on the button is to be selected. Although this reference enables a user to enter a desired character with only two button depressions, we have found that it also has the disadvantage of not allowing the user to designate whether an alphabetic character should be in an upper or lower case.

SUMMARY OF THE INVENTION

It is therefore an object of the present invention to provide an improved method and device for registering alphanumeric characters from a keypad of a push button telephone capable of entering alphanumeric characters.

It is another object to provide a method and device for easily and effectively registering alphanumeric characters using a keypad of a push button telephone capable of entering alphanumeric characters.

It is still another object to provide an alphanumeric registration method and device for classifying key pad entries into group information and party information, wherein such information represents one of arabic numerals, alphabetic capital letters, and alphabetic small letters.

It is yet another object to provide an alphanumeric registration method and device for registering a single alphanumeric character by entering two successive key inputs through a key pad capable of alphanumeric character entry.

It is a further object to provide an alphanumeric registration method and device capable of registering a user's desired identity into a system by entering a plurality of alphanumeric buttons classified into group information and party information.

It is still a further object to provide an alphanumeric registration method and device that easily registers identity or logo information to be used for one-touch dialing or speed-dialing operations in a facsimile machine or high performance telephone.

These and other objects may be achieved according to the principles of the present invention by classifying alphanumeric characters into groups and parties. The alphanumeric characters can be arabic numerals, alphabetic capital letters, or alphabetic small letters. A single alphanumeric character can be registered by inputting two successive key entries corresponding to an applicable group and party. Furthermore, the present invention can be applied to many types of products, thus allowing users to register alphanumeric information in devices such as high performance telephones and facsimile machines.

To further achieve the above objects, the alphanumeric registration method of the present invention contemplates the steps of: temporarily storing a first key input in first storage means; temporarily storing a second key input in second storage means; temporarily storing alphanumeric information generated by an alphanumeric registration subroutine having first key input and second key input as variable values in third storage means; and registering information stored in third storage means into an alphanumeric registration area when the amount of alphanumeric information stored in third storage means reaches a predetermined value or a key input from a user indicates that registration is to be terminated.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4A and 4B illustrate embodiments of memories used to store alphanumeric information for one-touch dialing and speed dialing operations, respectively.

DETAILED DESCRIPTION OF THE INVENTION

Figure 1:
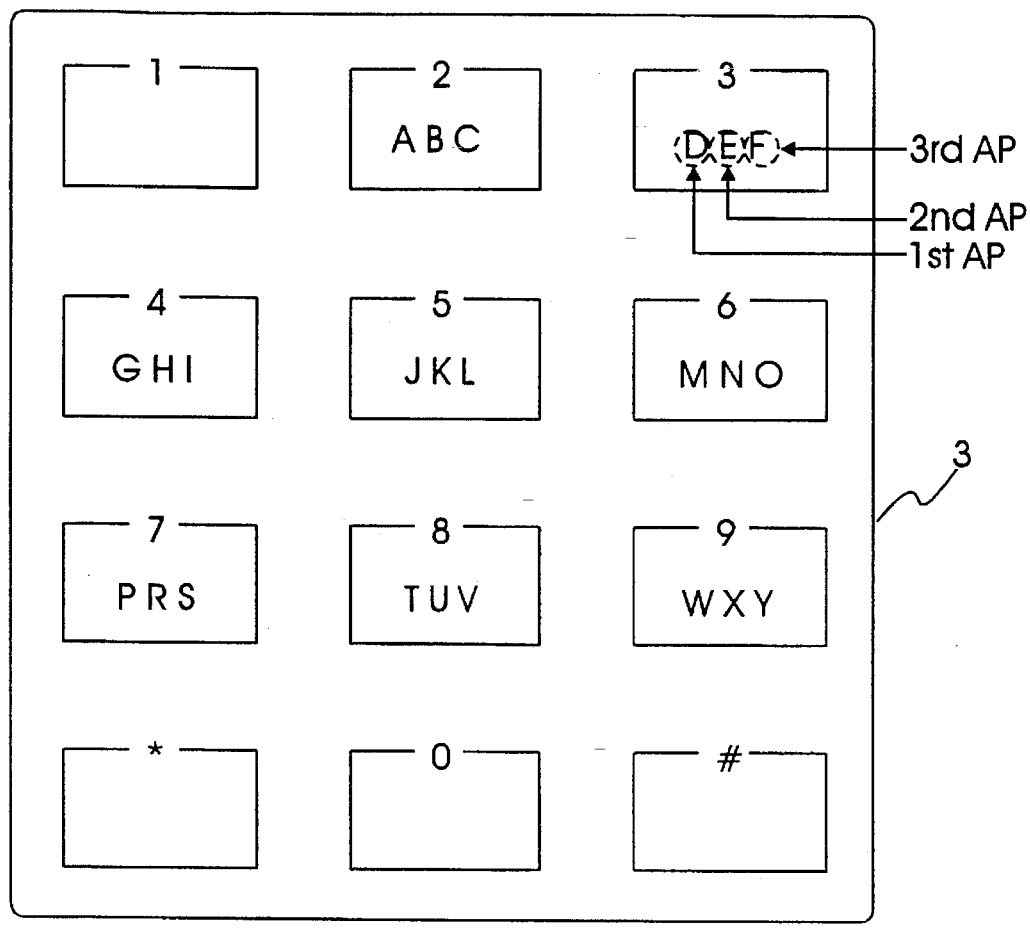
FIG. 1 is a general layout of a telephone key pad capable of entering alphanumeric characters.

FIG. 1 illustrates a general layout of a key pad of a push button telephone capable of entering alphanumeric characters. In order to be suitable for use in the multiple depression method, the keypad represented in FIG. 1 must have alphanumeric entry capability. According to the conventional multiple depression method previously described, for entry of the capital letter 'A', the numeric button '2' must be pressed once, and for entry of the capital letter 'B', the numeric button '2' must be pressed two times in continuous succession. To enter the capital letter 'C', the numeric button '2' must be pressed three times in continuous succession.

The "Panasonic" Model KX-F230 facsimile unit has the same keypad as FIG. 1, and its alphanumeric entry method is as follows. To enter the capital letter 'A', the numeric button '2' and the '*' button must be pressed in continuous succession. To enter the arabic numeral '2', the numeric button '2' must be pressed seven times in continuous succession, followed by the '*' button being pressed once. The '*' key indicates completion of an entry after a corresponding button has been pressed a desired number of times. Taking numeric button '2' as an example, a symbol to be entered is selected in the order of 'A','B','C','a','b','c','2'. Each time numeric button '2' is pressed, the next symbol in the above sequence is activated. In order to enter one of the alphabetic capital letters 'A','B','C',..., numeric button '2' must be pressed from one to three times in continuous succession, to enter one of the alphabetic small letters 'a','b','c',..., numeric button '2' must be pressed from four to six times in continuous succession, and to enter the arabic numeral 2, the numeric button '2' must be pressed seven times in continuous succession. This method is inconvenient however, since it requires a multitude of button depressions in order to enter alphanumeric characters.

In the present invention, an alphabetic character at a first position of each numeric button of a standard 4×3 keypad of a telephone is referred to as a first alphabetic character, 1st AP, an alphabetic character at a second position thereof is referred to as a second alphabetic character, 2nd AP, and an alphabetic character at a third position thereof is referred to as a third alphabetic character, 3rd AP.

In the present invention, to enable entry and registration of arabic numerals '0' through '9', alphabetic capital letters 'A' through 'Y' (excluding 'Q'), and alphabetic small letters 'a' to 'y' ( excluding 'q'), each of these alphanumeric characters is classified into one of ten groups and one of seven parties. The ten groups are formed by defining the respective arabic numerals 0 through 9 as groups. The seven parties (i.e. party 0 through party 6) are defined as follows.

Party 0: 1,2,3,4,5,6,7,8,9,0
Party 1: A,D,G,J,M,P,T,W
Party 2: B,E,H,K,N,R,U,X
Party 3: C,F,I,L,O,S,V,Y
Party 4: a,d,g,j,m,p,t,w
Party 5: b,e,h,k,n,r,u,x
Party 6: c,f,i,l,o,s,v,y Party 0 is composed of ten arabic numerals 0 through 9; party 1 is composed of the first alphabetic characters (in capitals) corresponding to each of the respective numeric buttons; party 2 is composed of the second alphabetic characters (in capitals) corresponding to each of the respective numeric buttons; and party 3 is composed of the third alphabetic characters (in capitals) corresponding to each of the respective numeric buttons.

Similarly, party 4 is composed of the first alphabetic characters (in lower case letters) corresponding to each of the respective numeric buttons; party 5 is composed of the second alphabetic characters (in lower case letters) corresponding to each of the respective numeric buttons; and party 6 is composed of the third alphabetic characters (in lower case letters) corresponding to each of the respective numeric buttons.

Accordingly, the alphanumeric characters in the present invention are represented by group and party information as disclosed in the following Table (1):

TABLE 1

| ALPHA NUMERIC | GROUP | PARTY |
| --- | --- | --- |
| 0 | 0 | 0 |
| 1 | 1 | 0 |

TABLE 1-continued

| ALPHA NUMERIC | GROUP | PARTY |
| --- | --- | --- |
| 2 | 2 | 0 |
| A | 2 | 1 |
| B | 2 | 2 |
| C | 2 | 3 |
| a | 2 | 4 |
| b | 2 | 5 |
| c | 2 | 6 |
| 3 | 3 | 0 |
| D | 3 | 1 |
| E | 3 | 2 |
| F | 3 | 3 |
| d | 3 | 4 |
| e | 3 | 5 |
| f | 3 | 6 |
| 4 | 4 | 0 |
| G | 4 | 1 |
| H | 4 | 2 |
| I | 4 | 3 |
| g | 4 | 4 |
| h | 4 | 5 |
| i | 4 | 6 |
| 5 | 5 | 0 |
| J | 5 | 1 |
| K | 5 | 2 |
| L | 5 | 3 |
| j | 5 | 4 |
| k | 5 | 5 |
| l | 5 | 6 |
| 6 | 6 | 0 |
| M | 6 | 1 |
| N | 6 | 2 |
| O | 6 | 3 |
| m | 6 | 4 |
| n | 6 | 5 |
| o | 6 | 6 |
| 7 | 7 | 0 |
| P | 7 | 1 |
| R | 7 | 2 |
| S | 7 | 3 |
| p | 7 | 4 |
| r | 7 | 5 |
| s | 7 | 6 |
| 8 | 8 | 0 |
| T | 8 | 1 |
| U | 8 | 2 |
| V | 8 | 3 |
| t | 8 | 4 |
| u | 8 | 5 |
| v | 8 | 6 |
| 9 | 9 | 0 |
| W | 9 | 1 |
| X | 9 | 2 |
| Y | 9 | 3 |
| w | 9 | 4 |
| x | 9 | 5 |
| y | 9 | 6 |

Figure 2:
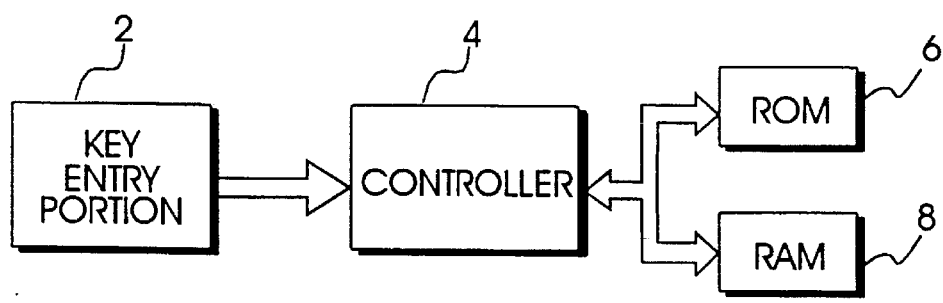
FIG. 2 is a block diagram of an alphanumeric registration system constructed according to the principles of the present invention.
Figure 5:
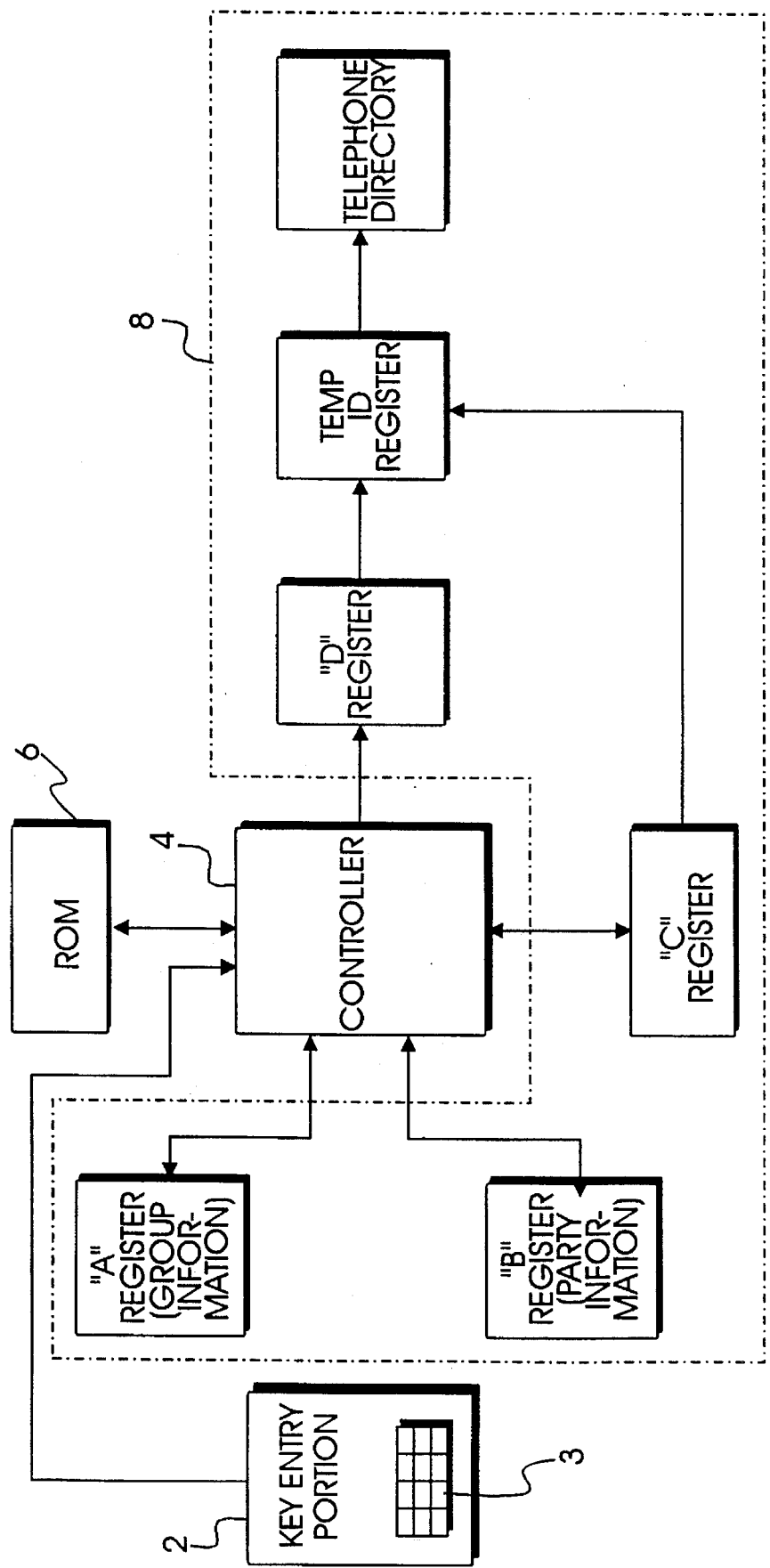
FIG. 5 is a block diagram showing the structural arrangement of the alpha numeric registration system according to the principles of the present invention.

FIG. 2 illustrates a block diagram of a system that performs alphanumeric registration according to group and party information shown in Table 1. The system includes: a key entry portion 2, having a keypad capable of alphanumeric character entry, for generating key information corresponding to a user input; a controller 4 for executing an alphanumeric registration subroutine that registers alphanumeric characters according to key information generated by key entry portion 2; a ROM 6 for storing the alphanumeric registration subroutine; and a RAM 8, composed of a plurality of registers, for temporarily storing key information generated by key entry portion 2, and also for storing a user's identification (such as logo) and telephone number into a telephone directory area. RAM 8 operates under the control of controller 4. FIG. 5 illustrates in greater detail, the system depicted in FIG. 2.

The alphanumeric registration subroutine, which performs alphanumeric registration in accordance with the group and party information shown in Table (1), is stored in ROM 6. The following embodiment of the present invention [1], illustrates the alphanumeric registration subroutine when programmed in 'C' language.

Embodiment [1]:

```
Character            Subroutine_Alpha_Numeric(A, B)
   ↓                                     ↓ ↓
  <1>                int A,B;          <2> <3>
                     {
                         return(AN[7*A+B]);
                     }

Character AN[70]= { '0', '0', '0', '0', '0', '0', '0',    ← 0 group
                    '1', '1', '1', '1', '1', '1', '1',    ← 1 group
                    '2', 'A', 'B', 'C', 'a', 'b', 'c',    ← 2 group
                    '3', 'D', 'E', 'F', 'd', 'e', 'f',    ← 3 group
                    '4', 'G', 'H', 'I', 'g', 'h', 'i',    ← 4 group
                    '5', 'J', 'K', 'L', 'j', 'k', 'l',    ← 5 group
                    '6', 'M', 'N', 'O', 'm', 'n', 'o',    ← 6 group
                    '7', 'P', 'R', 'S', 'p', 'r', 's',    ← 7 group
                    '8', 'T', 'U', 'V', 't', 'u', 'v',    ← 8 group
                    '9', 'W', 'X', 'Y', 'w', 'x', 'y' }   ← 9 group
                     ↑   ↑   ↑   ↑   ↑   ↑   ↑
            party:   0   1   2   3   4   5   6
```

In embodiment [1], Character(<1>) represents that a value generated by this subroutine will be an alphanumeric character. A(<2>) is indicative of group information (i.e. group 0 through group 9) and B(<3>) is indicative of party information (i.e. party 0 through party 6).

Although the alphanumeric registration subroutine shown in embodiment [1] above is illustrated in 'C' language, it is clearly obvious to those skilled in the art that algorithms performing the same functions can be programmed using other high level programming languages such as BASIC, FORTRAN, COBOL, etc.

During execution of the alphanumeric registration subroutine shown in embodiment [1] above, controller 4 enables temporary storage of information corresponding to entered alphanumeric characters to a predetermined portion of memory within RAM 8.

Figure 3:
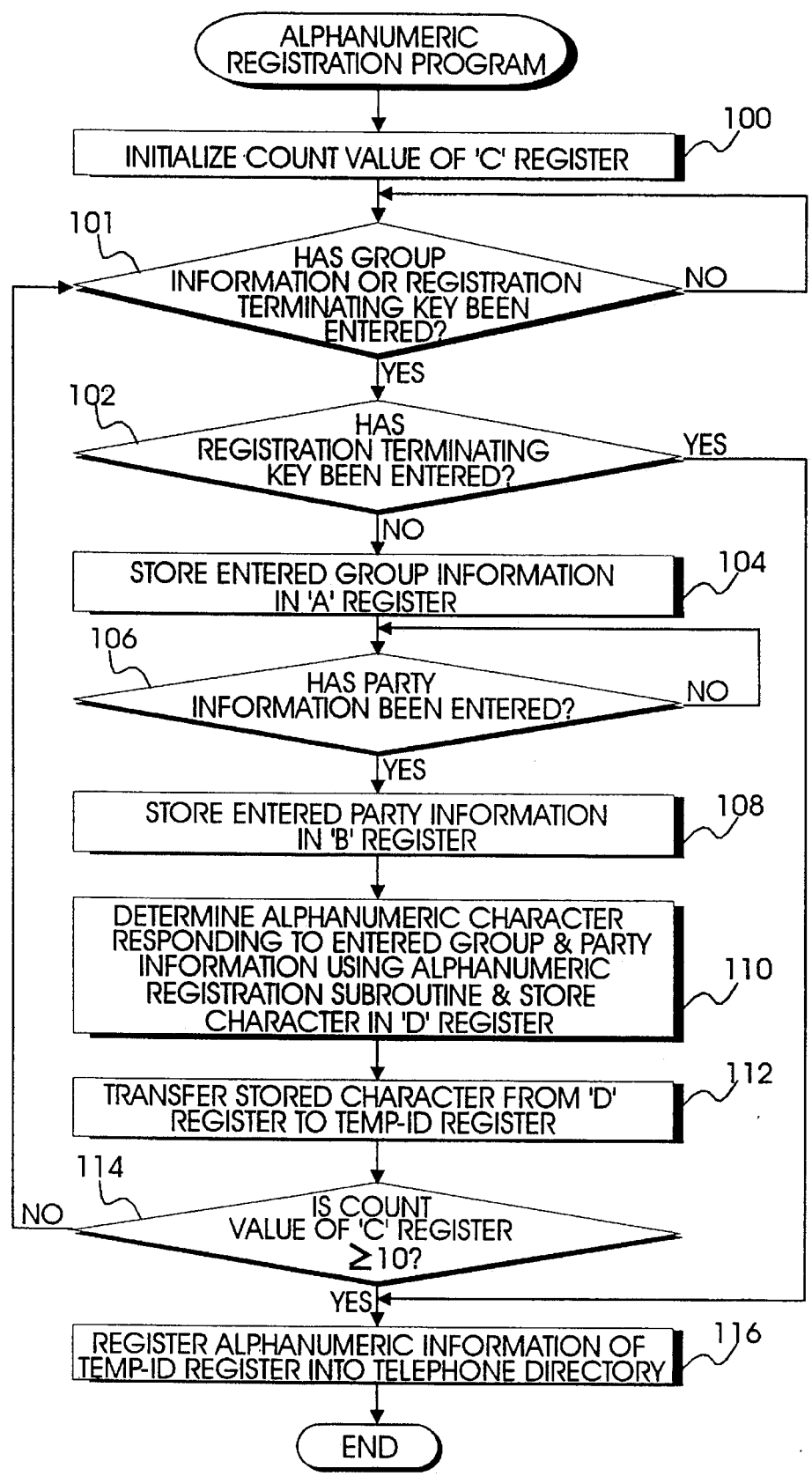
FIG. 3 is a flow chart representing control of alphanumeric registration according to the principles of the present invention.

FIG. 3 is a flow chart illustrating the operations of controller 4 when alphanumeric characters are registered.

FIGS. 4A and 4B are embodiments of memories used as telephone directory areas to store alphanumeric information for one-touch dialing and speed dialing operations, respectively, in a facsimile machine or high performance telephone.

In the present invention, RAM 8 is composed of an 'A' register, a 'B' register, a 'C' register, a 'D' register, a TEMP_ID register and a telephone directory. Memory regions implemented to perform one-touch dialing and speed-dialing operations are included in alternative embodiments.

Referring to FIG. 5, 'A' register is a portion of memory for temporarily storing group information, 'B' register is a portion of memory for temporarily storing party information, and 'D' register is a portion of memory for temporarily storing alphanumeric information generated from the alphanumeric registration subroutine. 'C' register is a portion of memory for storing information indicative of a total number of alphanumeric characters that have been entered. 'C' register also performs a counting operation, increasing a count value by 1 as each additional alphanumeric character is entered. TEMP_ID register is a portion of memory for temporarily storing information indicative of alphanumeric characters that have been entered. TEMP_ID register continues to store such information until the counting operation of 'C' register indicates that a predetermined number of alphanumeric characters have been entered, and therefore registration is complete. A telephone directory is a portion of memory for storing the alphanumeric characters stored in TEMP_ID register after registration is complete.

Hereinafter, the alphanumeric registration control process according to the present invention will be described in detail with reference to FIGS. 1 through 5.

Referring to FIG. 3, controller 4 enables 'C' register of RAM 8 to set a count value to 0 and also to store the count value, in step 100.

At this point, a user can enter a desired alphanumeric character by utilizing a push button telephone like the one shown in FIG. 1. An alphanumeric character is entered by first pressing a button corresponding to group information, and immediately thereafter pressing a button corresponding to party information. Group and party information corresponding to each alphanumeric character is shown in Table (1).

In step 101, controller 4 determines whether a key has been entered at key entry portion 2. If an alphanumeric key has been entered, controller 4 enables data indicative of selected group information to be stored in 'A' register of RAM 8, in step 104. If, however, the key input is determined to be a preset registration terminating key in step 102, all entered alphanumeric key data is transmitted to and stored in the telephone directory in step 116, and the program is ended. The registration terminating key is input after all desired alphanumeric characters have been entered indicating a user's intention to terminate registration.

In step 106, after a first alphanumeric key has been entered, controller 4 determines whether a next alphanumeric key is entered. If the next alphanumeric key is entered, controller 4 enables data indicative of selected party information to be stored in 'B' register of RAM 8, in step 108. Then, in step 110, controller 4 enables alphanumeric information generated from the alphanumeric registration subroutine {D=Subroutine_Alpha_Numeric (A,B)} of the above embodiment [1] to be stored in 'D' register of RAM 8. The alphanumeric information generated from the subroutine corresponds to the group and party information stored in 'A' register and 'B' register, respectively. In step 112, controller 4 enables transfer of the alphanumeric information stored in 'D' register to TEMP_ID register. Also, in step 112, controller 4 increments the count value of 'C' register by one. Controller 4 then, in step 114, determines from the count value stored in 'C' register whether a pro-set maximum number of alphanumeric characters have been entered. (In the disclosed embodiment, the preset maximum number is selected to be ten characters, for purposes of example.) Then, in step 116, if the pre-set maximum number of alphanumeric characters has been entered, controller 4 enables the alphanumeric information stored in TEMP_ID register to be registered into the telephone directory. If, however, the number of alphanumeric characters entered is determined to be less than the preset maximum number, the process returns to step 101, and controller 4 again determines whether an alphanumeric key has been entered at key entry portion 2. Thereafter, the steps described above are repeated. During repetition, if the registration terminating key is entered by the user in step 102, or if the preset maximum number of alphanumeric characters is entered in step 114, all of the alphanumeric information stored in TEMP_ID register at that time is registered into the telephone directory in step 116, and the alphanumeric registration control process is ended.

FIGS. 4A and 4B are embodiments of memories used as the telephone directory to store alphanumeric information for one-touch dialing and speed dialing operations, respectively, in a facsimile machine or high performance telephone.

Preconditions for utilizing the embodiments shown in FIGS. 4A and 4B when performing one-touch dialing and speed-dialing operations are as follows:

Precondition (i): A telephone number has a maximum length of ten characters. A user's identification also has a maximum length of ten characters, including the '?' character representing the registration terminating key.

Precondition (ii): A starting address in each memory is set to X000, where X is a positive integer.

Precondition (iii): A terminating alphanumeric character, for indicating the end of each user identification and telephone number, is designated as '?'.

The memory map corresponding to the one-touch dial operation is now described with reference to FIG. 4A.

The memory addresses begin with address 1000 and proceed consecutively through address 1039, for purposes of example. Reference numeral 40 represents a first portion of memory corresponding to a first user. This first portion includes an area 42 for storing a first telephone number (TEL No. 1) and an area 44 for storing a first identification code (ID 1). Accordingly, memory information corresponding to first memory portion 40 includes a one-touch code number of 1, TEL No.:123-4567, and ID:GGS. That is, first telephone number 123-4567, corresponding to identification code GGS, can be dialed by pressing the button corresponding to alphanumeric character '1' once.

Reference numeral 46 represents a second portion of memory corresponding to a second user. The second portion, like the first portion 40, includes an area 48 for storing a second telephone number (TEL No. 2) and an area 50 for storing a second identification code (ID 2). Accordingly, memory information corresponding to second memory portion 46 includes a one-touch code number of 2, TEL No.:59-4258, and ID:Kang30. That is, second telephone number 59-4258, corresponding to identification code Kang30, can be dialed by pressing the button corresponding to alphanumeric character '2' once.

The memory map of FIG. 4B, corresponding to the speed-dial operation, has the same general structure as the memory shown in FIG. 4A. In FIG. 4B, memory addresses begin with address 2000 and proceed consecutively through address 2029, for purposes of example. Reference numeral 60 represents a first portion of memory corresponding to a first user. This first portion includes an area 62 for storing a first telephone number (TEL No. 1) and an area 64 for storing a first identification code (ID 1). Accordingly, memory information corresponding to first memory portion 60 includes a speed-dial code number of 1, TEL No.: 98-7654, and ID:GOOD. That is, first telephone number 98-7654, corresponding to identification code GOOD, can be speed-dialed by entering alphanumeric character '1'.

As described above, alphanumeric information indicative of a party's telephone number and identification can be easily registered in a designated memory portion (i.e. telephone directory) by using an alphanumeric registration method. Furthermore, a user can conveniently dial that party's number since the disclosed alphanumeric registration method can be applied to high performance telephones and facsimile machines having speed-dialing and one-touch dialing functions.

It will be obvious to those skilled in the art that the alphanumeric registration method of the present invention can be applied to facsimile machines, audio response systems (ARS), or voice mailing systems (VMS), etc., and with various changes and modifications, can also be adapted to other products having alphanumeric key entry. With respect to facsimile machines, a transmitter's logo, telephone, etc. can be printed and transmitted on a cover page. With respect to high performance telephones, one-touch dialing and speed-dialing operations can be performed. Moreover, telephones having a display portion can display alphanumeric information indicative of a telephone number, identification, etc. to a user.

As described above, the present invention provides an alphanumeric character registration method and device therefor, capable of easily entering alphanumeric characters via a push button telephone. Pursuant to the principles of the present invention, alphanumeric characters are classified into groups and parties. These classifications enable alphanumeric information in the form of arabic numerals, alphabetic capital letters and alphabetic small letters to be entered by two successive key inputs corresponding to the applicable group and party. Accordingly, there is an advantage of reducing the number of key inputs required to enter a single alphanumeric character by 2.5 times. Furthermore, the present invention implements this method by utilizing standard telephone key pad, thereby removing the complexity and ambiguity of using a more detailed device. Accordingly, any user can easily register alphanumeric information by utilizing the principles of the present invention.

What is claimed is:

1. An alphanumeric registration method for use in a system having a push button telephone with alphanumeric entry keys, comprising the steps of:

classifying alphanumeric characters into respective sets of data each comprised of a group value and a party value, said alphanumeric characters comprising arabic numerals, upper case alphabetic characters, and lower case alphabetic characters;

selecting a single alphanumeric character in response to two successive key strokes of said alphanumeric entry keys that respectively define said group value and said party value, said single alphanumeric character being generated by performing an alphanumeric registration subroutine using said group value and said party value;

said single alphanumeric character generated being one of said arabic numerals when said group value is equal to a value represented by said one of said arabic numerals and said party value is equal to a first value;

said single alphanumeric character generated being one of said upper case alphabetic characters when said group value is equal to a value indicated on said alphanumeric entry keys corresponding to said one of said upper case alphabetic characters and said party value is equal to one of a plurality of second values;

said single alphanumeric character generated being one of said lower case alphabetic characters when said group value is equal to a value indicated on said alphanumeric entry keys corresponding to said one of said lower case alphabetic characters and said party value is equal to one of a plurality of third values; and storing said single alphanumeric character in storage means within said system by creating a physical characteristic distinctly representative of said single alphanumeric character within said storage means.

2. The alphanumeric registration method as claimed in claim 1, further comprising steps of:

storing said group value in a first memory; and storing said party value in a second memory.

3. The alphanumeric registration method as claimed in claim 1, wherein said alphanumeric characters are classified using ten group values and seven party values.

4. The alphanumeric registration method as claimed in claim 3, wherein said ten group values are represented by said arabic numerals 0 through 9 indicated on said alphanumeric entry keys.

5. The alphanumeric registration method as claimed in claim 4, wherein each of said seven party values represents one of a plurality of said arabic numerals, a plurality of said upper case alphabetic characters, and a plurality of said lower case alphabetic characters.

6. An alphanumeric registration method, comprising the steps of:

generating first key data and second key data by manually manipulating a plurality of alphanumeric entry keys of a system using a push button telephone set with said alphanumeric entry keys collectively representing a plurality of alphanumeric symbols, said plurality of alphanumeric symbols being greater than said plurality of alphanumeric entry keys;

temporarily storing said first key data in a first temporary memory, after entering said first key data as a first electrical signal through said alphanumeric entry keys;

temporarily storing said second key data in a second temporary memory, after entering said second key data as a second electrical signal through said alphanumeric entry keys;

temporarily storing in a third temporary memory alphanumeric information generated by performing an alphanumeric registration subroutine using said first key data and said second key data as variable electrical values, said alphanumeric information comprising one of said plurality of alphanumeric symbols; and registering said alphanumeric information temporarily stored in said third temporary memory into an alphanumeric registration memory area when a predetermined quantity of said alphanumeric information has been generated after repeating said steps of temporarily storing said first key data, said second key data and said alphanumeric information.

7. The alphanumeric registration method as claimed in claim 6, said step of registering said alphanumeric information further comprising the step of:

registering a current amount of said alphanumeric information temporarily stored in said third temporary storage means into said alphanumeric registration memory area whenever registration terminating information indicating an end of said alphanumeric registration method is entered through said alphanumeric entry keys.

8. The alphanumeric registration method as claimed in claim 6, wherein said first key data corresponds to group information designated in said alphanumeric registration subroutine, and said second key data corresponds to party information designated in said alphanumeric registration subroutine.

9. The alphanumeric registration method as claimed in claim 8, wherein said group information is classified into ten groups and each of said ten groups is represented by one of said alphanumeric entry keys, and said party information is classified into seven parties and each of said seven parties is represented by one of said alphanumeric entry keys.

10. An alphanumeric registration device for use in a system having a push button telephone with alphanumeric entry keys, said alphanumeric registration device comprising:

alphanumeric registration control means for controlling alphanumeric registration within said system;

first temporary storage means for temporarily storing first key data entered through said alphanumeric entry keys, said first key data being indicative of group information;

second temporary storage means for temporarily storing second key data entered through said alphanumeric entry keys, said second key data being indicative of party information;

alphanumeric information generation means for generating alphanumeric information in dependance upon said first key data and said second key data as variable values, said alphanumeric information being generated under control of said alphanumeric registration control means;

third temporary storage means for temporarily storing at least one item of alphanumeric information generated from said alphanumeric information generation means under the control of said alphanumeric registration control means; and alphanumeric registration memory means for registering the alphanumeric information under the control of said alphanumeric registration control means whenever a predetermined quantity of said alphanumeric information is stored in said third temporary storage means.

11. The alphanumeric registration device as claimed in claim 10, wherein said alphanumeric information, said group information and said party information correlate according to the following arrangement:

| ALPHA NUMERIC INFORMATION | GROUP INFORMATION | PARTY INFORMATION |
| --- | --- | --- |
| 0 | 0 | 0 |
| 1 | 1 | 0 |
| 2 | 2 | 0 |
| A | 2 | 1 |
| B | 2 | 2 |
| C | 2 | 3 |
| a | 2 | 4 |
| b | 2 | 5 |
| c | 2 | 6 |
| 3 | 3 | 0 |
| D | 3 | 1 |
| E | 3 | 2 |
| F | 3 | 3 |
| d | 3 | 4 |
| e | 3 | 5 |
| f | 3 | 6 |
| 4 | 4 | 0 |
| G | 4 | 1 |
| H | 4 | 2 |
| I | 4 | 3 |
| g | 4 | 4 |
| h | 4 | 5 |
| i | 4 | 6 |
| 5 | 5 | 0 |
| J | 5 | 1 |
| K | 5 | 2 |
| L | 5 | 3 |
| j | 5 | 4 |
| k | 5 | 5 |
| l | 5 | 6 |
| 6 | 6 | 0 |
| M | 6 | 1 |
| N | 6 | 2 |
| O | 6 | 3 |
| m | 6 | 4 |
| n | 6 | 5 |
| o | 6 | 6 |
| 7 | 7 | 0 |
| P | 7 | 1 |
| R | 7 | 2 |
| S | 7 | 3 |
| p | 7 | 4 |
| r | 7 | 5 |
| s | 7 | 6 |
| 8 | 8 | 0 |
| T | 8 | 1 |
| U | 8 | 2 |
| V | 8 | 3 |
| t | 8 | 4 |
| u | 8 | 5 |
| v | 8 | 6 |
| 9 | 9 | 0 |
| W | 9 | 1 |
| X | 9 | 2 |
| Y | 9 | 3 |
| w | 9 | 4 |
| x | 9 | 5 |
| y | 9 | 6 |

12. A method for registering alphanumeric characters in a system having a push button telephone with alphanumeric entry keys, said method comprising the steps of:

entering a first numeric value as a first electrical signal via said alphanumeric entry keys, said first numeric value being indicative of a group value;

entering a second numeric value as a second electrical signal via said alphanumeric entry keys, said second numeric value being indicative of a party value;

generating an alphanumeric symbol corresponding to said group value and said party value, said alphanumeric symbol being one of a numeric symbol and an alphabetic symbol, said alphabetic symbol being in one of an upper case and a lower case;

said alphanumeric symbol generated being said numeric symbol whenever said group value is equal to a value represented by said numeric symbol and said party value is equal to a first value;

said alphanumeric symbol generated being said alphabetic symbol in said upper case whenever said group value is equal to a value indicated on said alphanumeric entry keys corresponding to said alphabetic symbol and said party value is equal to one of a plurality of second values;

said alphanumeric symbol generated being said alphabetic symbol in said lower case whenever said group value is equal to said value indicated on said alphanumeric entry keys corresponding to said alphabetic symbol and said party value is equal to one of a plurality of third values; and registering said alphanumeric symbol in an alphanumeric registration memory within said system.

13. The method for registering alphanumeric characters as claimed in claim 12, further comprising the step of registering additional alphanumeric symbols in said alphanumeric registration memory until one of a first condition and a second condition occurs, said first condition being that a quantity of said alphanumeric symbols becomes a predetermined maximum quantity, said second condition being that a registration terminating signal is entered through said alphanumeric entry keys.

14. The method for registering alphanumeric characters as claimed in claim 12, wherein said step of generating said alphanumeric symbol is performed according to an alphanumeric registration subroutine stored in a register within said system.

15. The method for registering alphanumeric characters as claimed in claim 12, wherein said alphanumeric registration memory registers said alphanumeric symbol for use in a one-touch dialing operation.

16. The method for registering alphanumeric characters as claimed in claim 12, wherein said alphanumeric memory registers said alphanumeric symbol for use in a speed-dialing operation.

17. The method for registering alphanumeric characters as claimed in claim 12, further comprising steps of:

storing said first numeric value in a first memory after said entering of said first numeric value; and storing said second numeric value in a second memory after said entering of said second numeric value.

18. An alphanumeric registration device for use in a system having a push button telephone with alphanumeric entry keys, said alphanumeric registration device comprising:

alphanumeric registration control means for controlling alphanumeric registration within said system;

first storage means for temporarily storing a first key input entered as a first electrical signal through said alphanumeric entry keys, said first key input indicative of a group value;

second storage means for temporarily storing a second key input entered as a second electrical signal through said alphanumeric entry keys, said second key input indicative of a party value; and alphanumeric information generation means for generating an alphanumeric symbol under control of said alphanumeric registration control means, said alphanumeric symbol corresponding to said group value and said party value, said alphanumeric symbol being one of a numeric symbol and an alphabetic symbol, said alphabetic symbol being in one of an upper case and a lower case;

said alphanumeric symbol generated being said numeric symbol whenever said group value is equal to a value represented by said numeric symbol and said party value is equal to a first value;

said alphanumeric symbol generated being said alphabetic symbol in said upper case whenever said group value is equal to a value indicated on said alphanumeric entry keys corresponding to said alphabetic symbol and said party value is equal to one of a second, third and fourth value;

said alphanumeric symbol generated being said alphabetic symbol in said lower case whenever said group value is equal to said value indicated on said alphanumeric entry keys corresponding to said alphabetic symbol and said party value is equal to one of a fifth, sixth and seventh value.

19. The alphanumeric registration device as claimed in claim 18, further comprising:

third storage means for temporarily storing said alphanumeric symbol generated from said alphanumeric information generation means under the control of said alphanumeric registration control means; and alphanumeric registration memory means for registering said alphanumeric symbol after said alphanumeric symbol is stored in said third storage means whenever a registration termination key is input.

20. The alphanumeric registration device as claimed in claim 19, wherein said alphanumeric registration memory means registers said alphanumeric symbol for use in a one-touch dialing operation.

21. The alphanumeric registration device as claimed in claim 19, wherein said alphanumeric registration memory means registers said alphanumeric symbol for use in a speed-dialing operation.

22. An alphanumeric registration method for use in a system having alphanumeric entry keys, comprising the steps of:

entering a first numeric value as a first electrical signal via said alphanumeric entry keys, and storing said first numeric value in a first memory register within said system;

entering a second numeric value as a second electrical signal via said alphanumeric entry keys, and storing said second numeric value in a second memory register within said system; and generating an alphanumeric symbol in dependence upon said first numeric value and said second numeric value, and storing said alphanumeric symbol in a third memory register within said system, said alphanumeric symbol being one of a numeric symbol and an alphabetic symbol, said alphabetic symbol being in one of an upper case and a lower case;

said alphanumeric symbol generated being said numeric symbol whenever said first numeric value is equal to a value represented by said numeric symbol and said second numeric value is equal to a first value;

said alphanumeric symbol generated being said alphabetic symbol in said upper case whenever said first numeric value is equal to a value indicated on said alphanumeric entry keys corresponding to said alphabetic symbol and said second numeric value is equal to one of a second, third and fourth value; and said alphanumeric symbol generated being said alphabetic symbol in said lower case whenever said first numeric value is equal to said value indicated on said alphanumeric entry keys corresponding to said alphabetic symbol and said second numeric value is equal to one of a fifth, sixth and seventh value.

* * * * *